(12) United States Patent
Naganuma

(10) Patent No.: US 10,784,459 B2
(45) Date of Patent: Sep. 22, 2020

(54) DISPLAY DEVICE

(71) Applicant: Japan Display Inc., Minato-ku (JP)

(72) Inventor: Tomohiko Naganuma, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/217,673

(22) Filed: Dec. 12, 2018

(65) Prior Publication Data

US 2019/0189954 A1   Jun. 20, 2019

(30) Foreign Application Priority Data

Dec. 20, 2017   (JP) .................. 2017-244179

(51) Int. Cl.
*H01L 51/52*   (2006.01)
*H01L 51/50*   (2006.01)
(Continued)

(52) U.S. Cl.
CPC ...... *H01L 51/5212* (2013.01); *H01L 27/3246* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 51/5221* (2013.01); *H01L 51/5225* (2013.01); *H01L 51/5281* (2013.01); *H01L 51/56* (2013.01); *H01L 27/3216* (2013.01); *H01L 27/3218* (2013.01); *H01L 2227/323* (2013.01)

(58) Field of Classification Search
CPC ............ H01L 27/3276; H01L 27/3216; H01L 27/3218; H01L 27/3246; H01L 2227/323; H01L 51/5212; H01L 51/5225; H01L 51/5281; H01L 51/5221; H01L 51/56; H01L 51/5012; H01L 51/5072; H01L 51/5056; H01L 51/5092; H01L 51/5088; H01L 51/5203
See application file for complete search history.

(56) References Cited

U.S. PATENT DOCUMENTS 8,471,834 B2 * 6/2013 Yamamoto ........... G09G 3/3233
                                                         345/204
9,461,100 B2 * 10/2016 Sato .................... H01L 27/3246
(Continued)

FOREIGN PATENT DOCUMENTS

JP          2016-85913          5/2016

*Primary Examiner* — Galina G Yushina
(74) *Attorney, Agent, or Firm* — Oblon, McClelland, Maier & Neustadt, L.L.P.

(57) ABSTRACT

A display device includes: a plurality of pixel electrodes; a first carrier injection layer, a first carrier transport layer, a light-emitting layer, a second carrier transport layer, and a second carrier injection layer provided in order on the plurality of pixel electrodes; and a counter electrode provided on the second carrier injection layer. The second carrier has a polarity opposite to that of the first carrier. The counter electrode is connected to one layer of the first carrier transport layer and the first carrier injection layer, penetrating a layer situated between the one layer and the counter electrode, between the pixel electrodes adjacent to each other in a plan view. Alternatively, an upper surface of an intermediate electrode situated between the pixel electrodes adjacent to each other in a plan view is connected to the first carrier injection layer.

8 Claims, 11 Drawing Sheets

(51) Int. Cl.
    *H01L 27/32*    (2006.01)
    *H01L 51/56*    (2006.01)

(56) References Cited

U.S. PATENT DOCUMENTS

| | | | |
|---|---|---|---|
| 9,536,933 B2 * | 1/2017 | Sato | H01L 51/5088 |
| 2015/0144902 A1 * | 5/2015 | Do | H01L 27/3246 257/40 |
| 2016/0118449 A1 | 4/2016 | Sato et al. | |
| 2018/0301519 A1 * | 10/2018 | Ma | H01L 51/5215 |
| 2018/0358573 A1 * | 12/2018 | Maeda | H01L 51/5036 |
| 2018/0374909 A1 * | 12/2018 | Nishikiori | H01L 27/3223 |

* cited by examiner

DISPLAY DEVICE

CROSS-REFERENCE TO RELATED APPLICATION

The present application claims priority from Japanese application JP2017-244179 filed on Dec. 20, 2017, the content of which is hereby incorporated by reference into this application.

BACKGROUND OF THE INVENTION

1. Field of the Invention

The present invention relates to a display device.

2. Description of the Related Art

Recently, an increasing number of devices such as smartphones use an organic electroluminescense (EL) display device. The organic EL display device has a lower electrode provided for each pixel, an organic EL layer, and an upper electrode shared by a plurality of pixels. The organic EL layer includes a hole injection layer, a hole transport layer, a light-emitting layer, an electron transport layer, and an electron injection layer. In the organic EL display device provided with an organic EL layer covering a plurality of pixels, a current may leak from the pixel electrode of one pixel to the light-emitting layer of an adjacent pixel, causing the adjacent pixel to emit light. This phenomenon causes a problem in that, for example, the displayed color differs from the intended color (also referred to as color mixing or electrical color mixing).

JP2016-85913A proposes that an electrode for absorbing a leak current should be arranged on a bank in order restrain the occurrence of the phenomenon.

However, in JP2016-85913A, both of an electrode of a layer that is different from the lower electrode and the upper electrode and an insulating layer for insulating that electrode from the lower electrode and the upper electrode need to be provided in order to absorb a leak current. This complicates the manufacturing process.

SUMMARY OF THE INVENTION

In view of the foregoing problem, an object of the invention is to provide a display device that can restrain the phenomenon that, when one pixel emits light, an adjacent pixel emits light unexpectedly, by a simpler manufacturing process.

A display device according to an aspect of the invention includes: a substrate; a plurality of pixel electrodes provided above the substrate; a first carrier injection layer and a first carrier transport layer provided in order on the plurality of pixel electrodes; a light-emitting layer provided above the plurality of pixel electrodes and on the first carrier transport layer; a second carrier transport layer and a second carrier injection layer provided in order on the light-emitting layer; and a counter electrode provided above the plurality of pixel electrodes and on the second carrier injection layer. The second carrier has a polarity opposite to that of the first carrier. One layer of the first carrier transport layer and the first carrier injection layer has, between two pixel electrodes adjacent to each other in a plan view, a connection area exposed from a layer situated between the one layer and the counter electrode, wherein the two pixel electrodes are among the plurality of pixel electrodes. The counter electrode is connected to the one layer in the connection area.

A display device according to another aspect of the invention includes: a substrate; a plurality of pixel electrodes provided above the substrate; an intermediate electrode provided between two pixel electrodes adjacent to each other, wherein the two pixel electrodes are among the plurality of pixel electrodes; a first carrier injection layer and a first carrier transport layer provided in order on the plurality of pixel electrodes and the intermediate electrode; a light-emitting layer provided above the plurality of pixel electrodes and on the first carrier transport layer; a second carrier transport layer and a second carrier injection layer provided in order on the light-emitting layer; and a counter electrode provided above the plurality of pixel electrodes and on the second carrier injection layer. The intermediate electrode has a connection area connected to the first carrier injection layer.

According to the invention, a simpler manufacturing process can restrain the phenomenon that, when one pixel emits light, an adjacent pixel emits light unexpectedly.

DETAILED DESCRIPTION OF THE INVENTION

Figure 1:
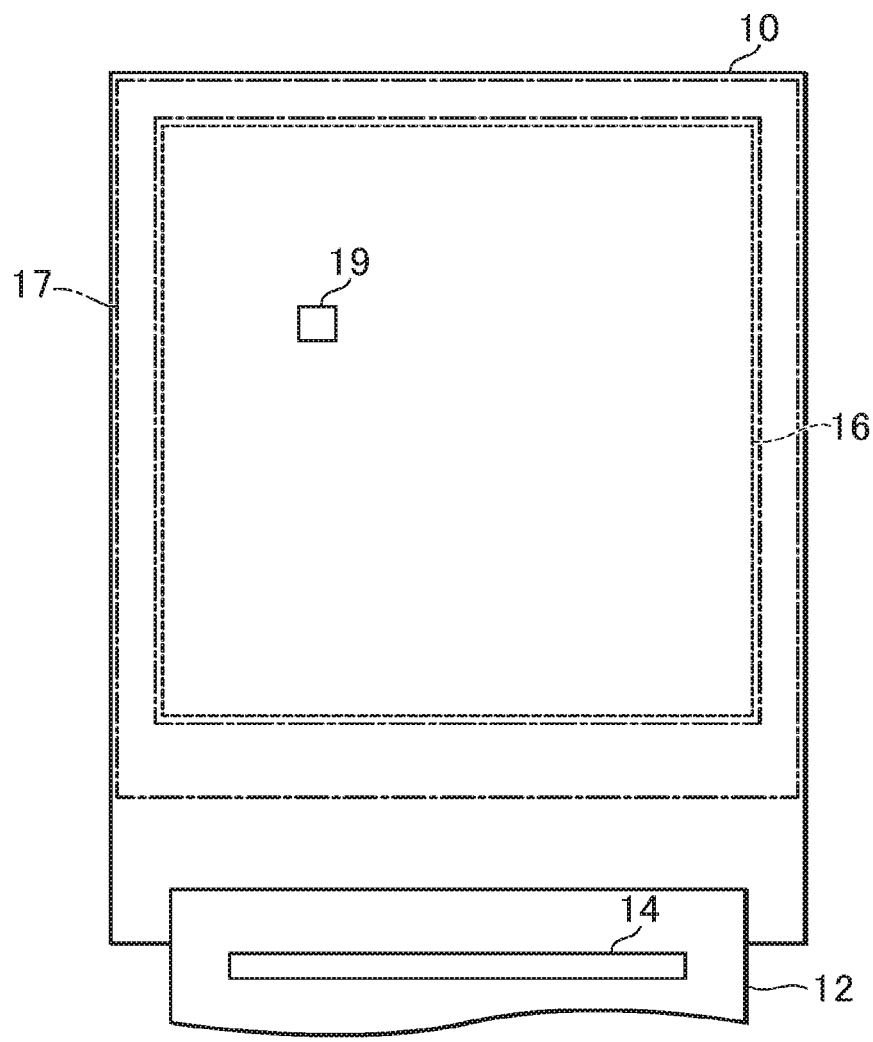
FIG. 1 is a plan view of an organic EL display device according to a first embodiment.

Hereinafter, embodiments of the invention will be described with reference to the drawings. However, the invention can be carried out in various other forms without departing from the spirit of the invention. The invention should not be interpreted as limited to the description of the embodiments below.

In order to clarify the explanation, the drawings may schematically show each part in terms of width, thickness, shape and the like, compared with the actual configurations. However, the drawings are simply an example and should not limit the interpretation of the invention. Also, in the specification and drawings, an element having a function similar to the one already described with reference to a previously described drawing may be denoted by the same reference characters, and detailed explanation of such an element may be omitted.

In the detailed description of the invention, the terms "on" and "under" to prescribe the positional relation between one component and another component refer to not only the case where one component is directly on or directly under another but also the case where still another component is provided between these components unless stated otherwise.

First Embodiment

FIG. 1 is a plan view of an organic EL (electroluminescence) display device according to a first embodiment of the invention. The organic EL display device includes a substrate 10, a flexible printed circuit board 12, and an integrated circuit package 14 arranged on the flexible printed circuit board 12. The organic EL display device according to this embodiment is a sheet display or flexible display that can bend. However, a display that does not bend may also be employed.

The substrate 10 includes a display area 16 and a peripheral area 17 surrounding the display area 16. The peripheral area 17 is situated on the outside of the display area 16. Inside the display area 16, a plurality of pixels 19 is arranged. The organic EL display device combines unit pixels (subpixels) of multiple colors made up of, for example, red, green, and blue, to form full-color pixels 19, and thus displays a full-color image. The flexible printed circuit board 12 is connected to an end in one direction of the substrate 10. On the integrated circuit package 14, a part of a drive circuit which drives a pixel circuit included in each unit pixel is installed. A part of the drive circuit is also arranged in the peripheral area 17 on the substrate 10.

Figure 2:
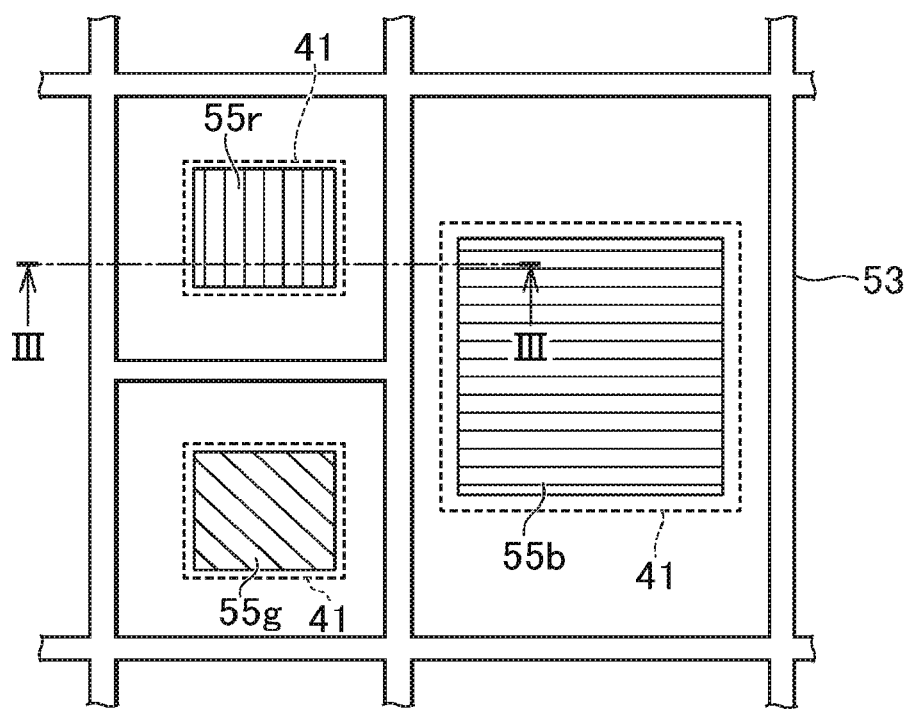
FIG. 2 is a partial plan view for schematically illustrating an example of the configuration of a pixel.

FIG. 2 is a partial plan view schematically showing an example of the configuration of the pixel 19. The pixel 19 has a red unit pixel having a light-emitting area 55r, a green unit pixel having a light-emitting area 55g, and a blue unit pixel having a light-emitting area 55b. Each of the light-emitting area 55r, the light-emitting area 55g, and the light-emitting area 55b overlaps a pixel electrode 41 in a plan view. In a plan view, the light-emitting area 55b is larger than the light-emitting areas 55r, 55g. The pixel 19 maybe made up of four or more unit pixels, or two unit pixels.

The light-emitting area 55r, the light-emitting area 55g, and the light-emitting area 55b, which are adjacent to each other as shown in FIG. 2, form one pixel 19. A connection area 53 is arranged between two light-emitting areas adjacent to each other, of the light-emitting areas 55r, 55g, 55b. In the example of FIG. 2, the pixel 19 is surrounded by the connection area 53 and each of the light-emitting areas 55r, 55g, 55b, too, is surrounded by the connection area 53. The connection area 53 is an area provided so that, when one of the light-emitting areas 55r, 55g, 55b emits light, the adjacent light emitting areas do not emit light. Details of this will be described later.

Figure 3:
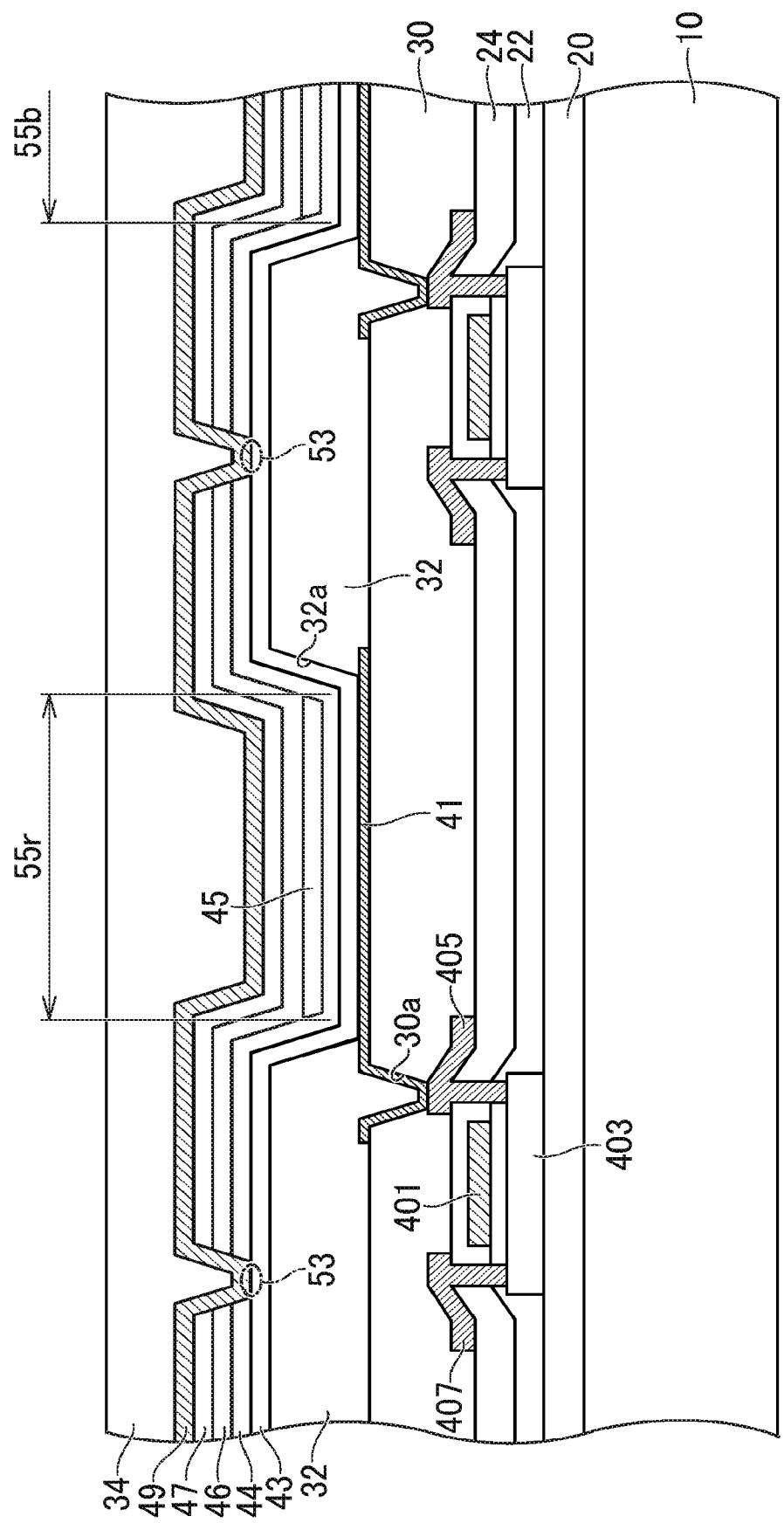
FIG. 3 is a cross-sectional view of the organic EL display device, taken along shown in FIG. 2.

FIG. 3 is a cross-sectional view of the organic EL display device, taken along shown in FIG. 2. The substrate 10 (array substrate) is flexible. The material of the substrate 10 is polyimide. However, any other resin material which is a base material may be used in case that the base material is flexible enough to form a sheet display or flexible display. In the case of a display device that is not a sheet display or flexible display, the material of the substrate 10 may be glass.

On the substrate 10, an underlying layer 20 containing silicon oxide and silicon nitride is provided. The underlying layer may be a three-layer structure made up of a first underlying layer, a second underlying layer, and a third underlying layer. For example, the first underlying layer is a silicon oxide layer to improve adhesion with the substrate 10. The second underlying layer is a silicon nitride layer to block moisture and impurities coming from outside. The third underlying layer blocks a hydrogen atom contained in the second underlying layer from diffusing toward a thin-film transistor situated above.

A plurality of thin-film transistors is formed on the underlying layer 20. Each of the thin-film transistors includes a gate electrode 401, a semiconductor film 403, a source electrode 405, and a drain electrode 407. The semiconductor film 403 is provided on the underlying layer 20. The semiconductor film 403 may be a polysilicon or transparent amorphous oxide semiconductor (TAOS). On the semiconductor film 403, a gate insulation layer 22 containing silicon oxide is provided. On the gate insulation layer 22, a first electrically conductive layer including the gate electrode 401, which overlaps the semiconductor film 403 in a plan view, is provided. The first electrically conductive layer is formed of, for example, MoW. On the gate electrode 401, an interlayer insulation layer 24 containing silicon nitride and silicon oxide is provided. The gate insulation layer 22 and the interlayer insulation layer 24 may be made of another insulative material.

On the interlayer insulation layer 24, a second electrically conductive layer including the source electrode 405 and the drain electrode 407 is provided. The source electrode 405 and the drain electrode 407 are connected to a wiring that forms a pixel circuit (for example, the pixel electrode 41). The second electrically conductive layer is, for example, a three-layer structure of Ti, Al, and Ti.

A flattening layer 30 is provided in such a way as to cover the source electrode 405 and the drain electrode 407. For the flattening layer 30, an organic material such as photosensitive acrylic is often used because of its higher surface flatness than an inorganic insulating material formed by CVD (chemical vapor deposition) or the like.

The flattening layer 30 has an opening 30a to expose the source electrode 405. The pixel electrode 41 is provided for electrically continuing to the source electrode 405 via this opening 30a. The pixel electrode 41 may be a three-layer structure made up of, for example, an IZO (indium-zinc-oxide) film, an Ag film, and an IZO film. The pixel electrode 41 extends laterally from the upper end of the opening 30a. Also, instead of the source electrode 405, the drain electrode 407 may be connected to the pixel electrode 41.

In the upper layer of the flattening layer 30 and the pixel electrode 41, a bank 32 is formed. The bank 32 covers the opening 30a. The bank 32 is formed of an insulative photosensitive acrylic or the like, similarly to the flattening layer 30. The bank 32 is provided between unit pixels adjacent to each other and has an opening 32a corresponding to a unit pixel. The lateral surface of the opening 32a is tapered. At the bottom of the opening 32a, the pixel electrode 41 is exposed from the bank 32.

On the pixel electrode 41, a hole injection layer 43, a hole transport layer 44, a light-emitting layer 45, an electron transport layer 46, and an electron injection layer 47 are provided in this order. An electron blocking layer may be provided between the hole transport layer 44 and the light-emitting layer 45. A hole blocking layer may be provided between the light-emitting layer 45 and the electron transport layer 46. These layers may be formed by vapor deposition or by coating. In this example, the light-emitting layer 45 is arranged inside the opening 32a, and the hole injection layer 43, the hole transport layer 44, the electron transport layer 46, and the electron injection layer 47 are formed continuously from the inside of the opening 32a of the bank 32 to the upper side of the bank 32, that is, on the lateral surface of the bank 32 and the upper surface of the bank 32. The light-emitting layer 45 may be disposed inside the opening 32a, on the sloped surface of the bank 32, and at a part of the upper surface of the bank 32.

The light-emitting layer 45 emits light by having an electron and a hole as carriers injected therein. To put it in a different perspective, the light-emitting layer 45 emits light due to a current flowing between the pixel electrode 41 and a counter electrode 49. The light-emitting layer 45 formed on the pixel electrode 41 in the opening 32a forms the light-emitting area 55r, 55g, 55b corresponding to the pixel electrode 41 and the opening 32a.

The hole injection layer 43 and the hole transport layer 44 are layers that facilitate injection of a hole as a carrier into the light-emitting layer 45. The electron transport layer 46 and the electron injection layer 47 are layer that facilitate injection of an electron as a carrier into the light-emitting layer 45.

The hole injection layer 43, the hole transport layer 44, the light-emitting layer 45, the electron transport layer 46, and the electron injection layer 47 may be formed by vapor deposition of their respective materials. The material of the light-emitting layer 45 may be vapor-deposited inside the opening 32a, using a mask, and then an opening in the electron transport layer 46, the electron injection layer 47, and the hole transport layer 44 may be formed using a mask. These layers may be formed by coating instead of vapor deposition.

The counter electrode 49 is provided on the electron injection layer 47. The counter electrode 49 maybe, for example, an Mg layer and Ag layer formed as a thin film that is thin enough to transmit light emitted from the organic EL layer, or may be formed of ITO. The counter electrode 49 is also provided on the bank 32. The counter electrode 49 is electrically connected to a wiring that supplies ground potential.

In the upper side of the bank 32, each of the electron injection layer 47, the electron transport layer 46, and the hole transport layer 44 has an opening. The positions of the openings overlap each other in a plan view. The connection area 53 of the hole injection layer 43 is exposed from the electron injection layer 47, the electron transport layer 46, and the hole transport layer 44 at the opening. In the example of FIG. 3, the counter electrode 49 is in contact with the hole injection layer 43 in the connection area 53.

On the counter electrode 49, a sealing layer 34 is provided. The sealing layer 34 prevents moisture from entering the organic EL layer from outside. The sealing layer 34 is, for example, a multilayer structure made up of a silicon nitride film, an organic resin layer, and a silicon nitride film.

A cover glass and a touch panel substrate or the like may be provided on the sealing layer 34. In this case, a filler such as a resin may fill the space between the sealing layer 34, and the cover glass or the touch panel substrate. A counter substrate using a flexible base material such as polyimide may be arranged on the sealing layer 34.

Figure 4:
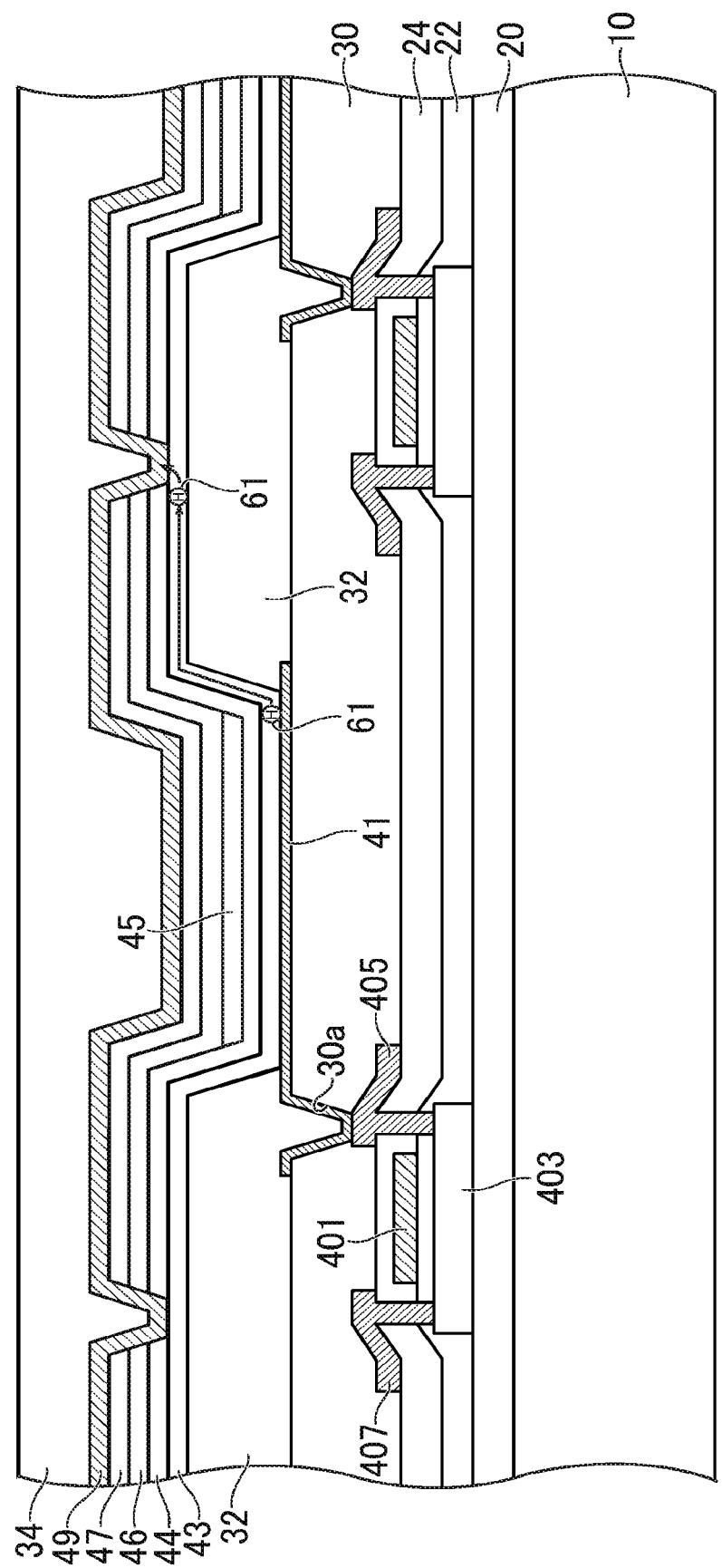
FIG. 4 is a diagram for illustrating a movement of a carrier.

FIG. 4 illustrates a movement of a carrier and corresponds to FIG. 3. As shown in FIG. 4, a hole 61, which is a carrier generated near the pixel electrode 41 of the hole injection layer 43, moves to above the bank 32 from the pixel electrode 41 due to an electric field generated inside the hole injection layer 43. The hole 61 is coupled with an electron supplied from the counter electrode 49 in the connection area 53 and thus vanishes. The hole 61 on the bank 32 vanishes near the connection area 53 and therefore does not reach the light-emitting layer 45 in the light-emitting area 55b beyond the connection area 53.

Figure 5:
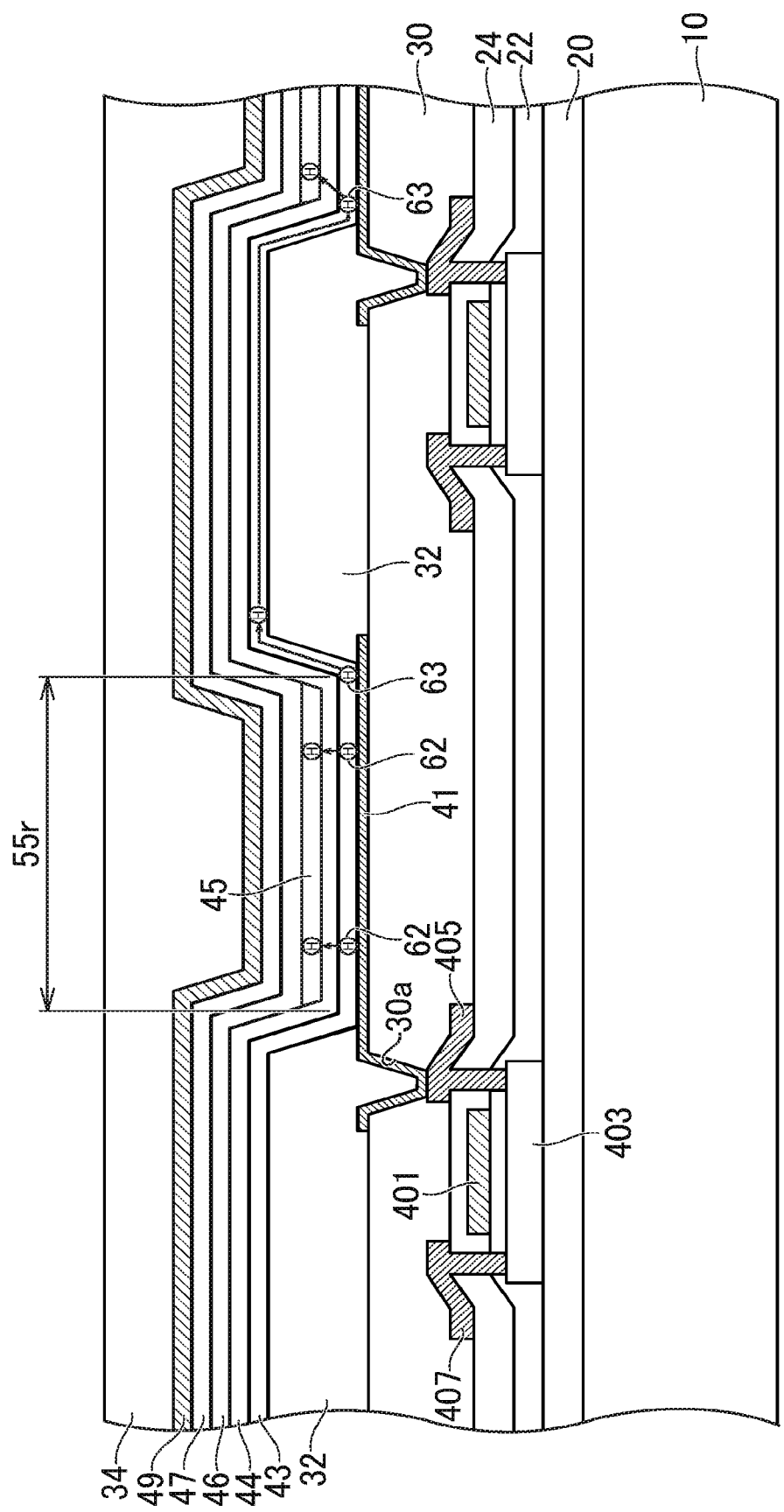
FIG. 5 is a cross-sectional view for illustrating a comparative example of the organic EL display device.

Meanwhile, if the connection area 53 is not provided, the hole 61 generated at the pixel electrode 41 in the light-emitting area 55r may reach the light-emitting layer 45 in the adjacent light-emitting area 55b. FIG. 5 is a cross-sectional view showing a comparative example of the organic EL display device. In the example of FIG. 5, the electron injection layer 47, the electron transport layer 46, the light-emitting layer 45, and the hole transport layer 44 do not have an opening above the bank 32, and the hole injection layer 43 is not in contact with another electrode such as the counter electrode 49, on the bank 32.

A large number of holes 62 which are carriers generated in the hole injection layer 43 due to a positive potential supplied to the pixel electrode 41 are coupled with electrons in the light-emitting layer 45 and thus vanish, causing the light-emitting layer 45 to emit light. Meanwhile, if a potential difference is generated between the pixel electrode 41 in the light-emitting area 55r and the adjacent pixel electrode 41, the potential difference generates an electric field that moves a hole 63 as a part of the holes. Due to the electric field, the hole 63 as apart of the holes moves over the bank 32 in the hole injection layer 43 and reaches the light-emitting layer 45 in the adjacent light-emitting area 55b. Therefore, when one light-emitting area 55r emits light, the adjacent light-emitting area 55b, too, slightly emits light. Meanwhile, in the configuration shown in FIGS. 3 and 4, the hole 61 vanishes in the connection area 53 on the bank 32 before reaching the adjacent light-emitting area 55b. Therefore, the adjacent light-emitting area 55b can be prevented from slightly emitting light unintentionally. A similar effect can be achieved for the other light-emitting areas 55r, 55g, 55b that are adjacent to each other.

Also, in the configuration shown in FIG. 3, the counter electrode 49 also serves as the cathode of the organic EL element and as the electrode for causing the hole on the bank 32 to vanish. Therefore, there is no need to form a separate electrode and an increase in manufacturing processes can be prevented.

Figure 6:
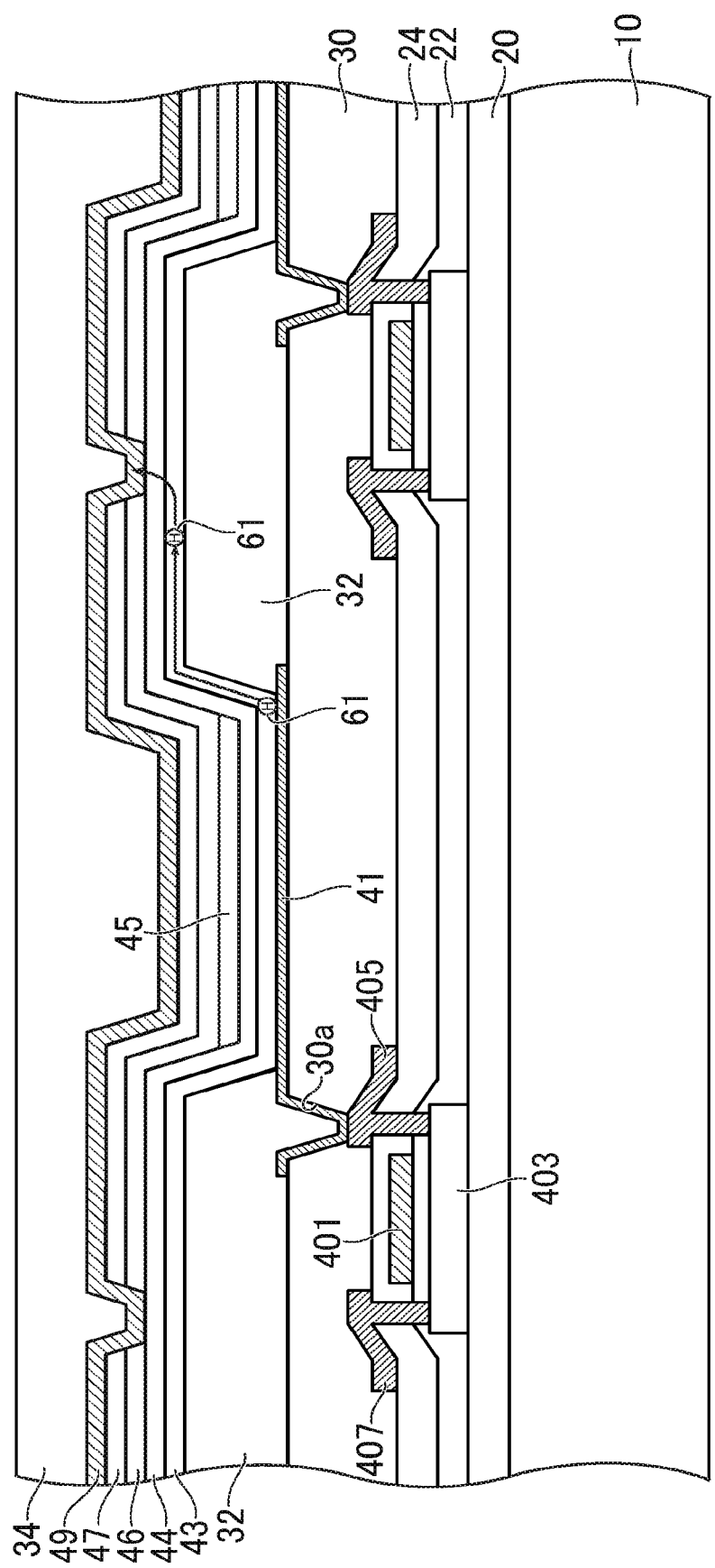
FIG. 6 is a cross-sectional view for illustrating a modification of the organic EL display device.

The connection area 53 in contact with the counter electrode 49 may be present in a different layer from the hole injection layer 43. FIG. 6 is a cross-sectional view showing a modification of the organic EL display device. In the example of FIG. 6, unlike the example of FIG. 3, the connection area 53 in contact with the counter electrode 49 is present on the hole transport layer 44. In the example of FIG. 6, the hole 61 moving onto the bank 32 from near the pixel electrode 41 in the hole injection layer 43 then moves to the hole transport layer 44 near the connection area 53. The hole 61 is also coupled with an electron supplied from the counter electrode 49 and thus vanishes. In this way, a similar effect can be achieved, even if the connection area 53 is present on the hole transport layer 44, and the hole injection layer 43 and the counter electrode 49 are not directly in contact with each other.

Figure 7:
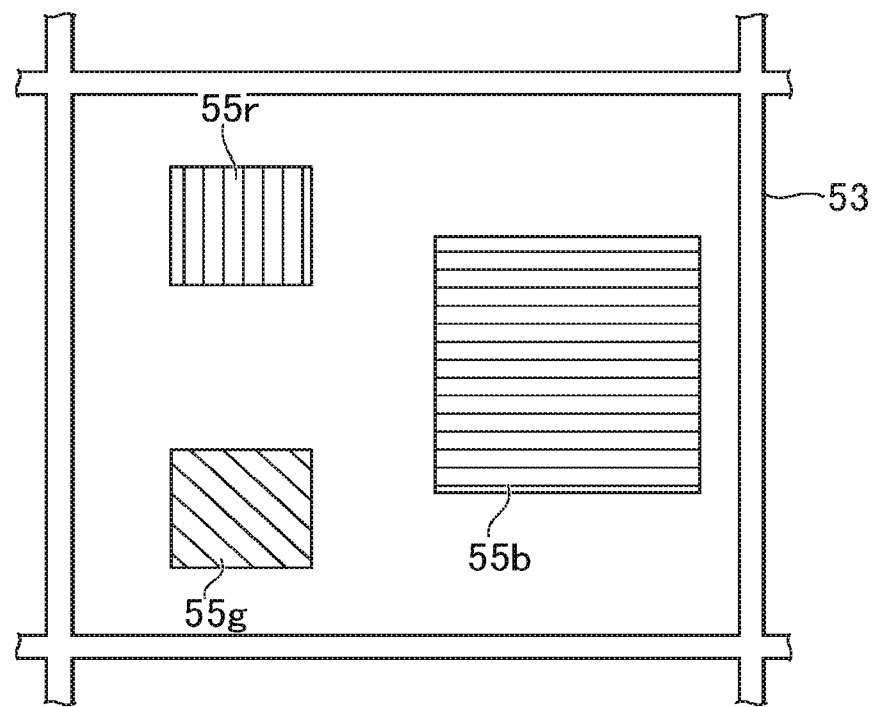
FIG. 7 is a partial plan view for illustrating another example of the configuration of a pixel.

The connection area 53 may not need to be provided in all the space between unit pixels. FIG. 7 is a partial plan view showing another example of the configuration of the pixel 19 and corresponds to FIG. 2. The pixel 19 is also arranged above, below, and to the left and right of the pixel 19 shown in FIG. 7. The connection area 53 is arranged in such a way as to surround the pixel 19 and also arranged between the pixel 19 and the adjacent pixel 19. The connection area 53 is not arranged between the light-emitting areas 55r, 55g, 55b arranged in one pixel 19. Thus, when the light-emitting areas 55r, 55g, 55b of a unit pixel belonging to the one pixel 19 emit light, the light-emitting areas 55r, 55g, 55b of another pixel 19 adjacent to the one pixel 19 can be prevented from slightly emitting light.

Figure 8:
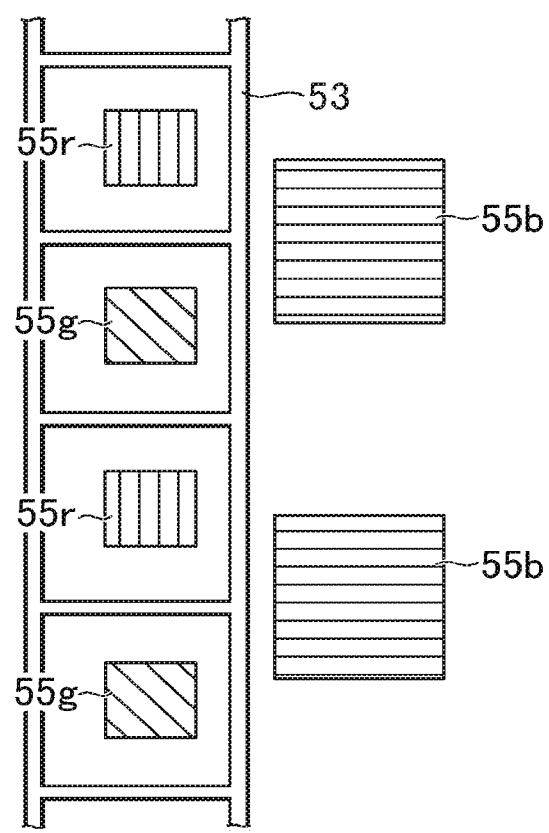
FIG. 8 is a plan view for illustrating another example of arrangement of a connection area.

FIG. 8 is a plan view showing another example of the arrangement of the connection area 53 and showing the arrangement of the connection area 53 in two pixels 19 longitudinally next to each other. In this embodiment, in a plan view, the pixel 19 includes a light-emitting area 55b that is larger than an average size (or much larger) and light-emitting areas 55r, 55g that are smaller than the average size (or smaller than the light-emitting area 55b). In the example of FIG. 8, the connection area 53 is arranged between the small-sized light-emitting areas 55r, 55g and the adjacent light-emitting areas 55r, 55g, 55b. The light-emitting areas 55r, 55g are surrounded by the connection area 53. Meanwhile, the connection area 53 is not arranged between the large-sized light-emitting area 55b and the other light-emitting area 55b adjacent to this light-emitting area 55b.

As the area of the light-emitting areas 55r, 55g, 55b decreases, the proportion of the circumference to the area thereof increases. Because of this, the light-emitting areas 55r, 55g having a small area tend to have a high rate of change in the amount of light emission by a carrier leaking from the adjacent other light-emitting areas 55r, 55g, 55b. That is, these light-emitting areas 55r, 55g are susceptible to the influence of the leaking carrier. Therefore, the influence of the leakage can be restrained even in the case where the connection area 53 is provided only between the light-emitting areas 55r, 55g which are smaller than the average size and the adjacent light-emitting areas 55r, 55g, 55b. If the light-emitting areas 55r, 55g have different sizes from each other, the connection area 53 may be arranged in such a way as to surround the smaller one of the light-emitting areas 55r, 55g.

Figure 9:
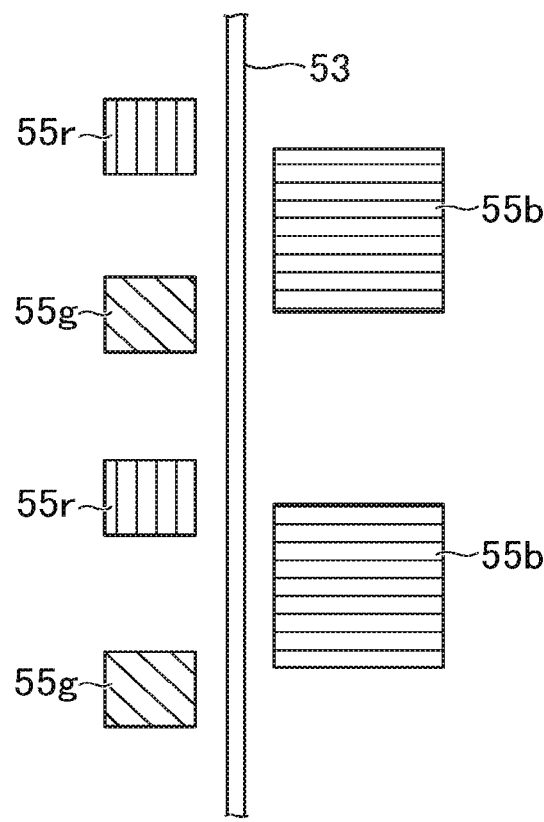
FIG. 9 is a plan view for illustrating another example of arrangement of a connection area.

FIG. 9 is a plan view showing another example of the arrangement of the connection area 53 and showing the arrangement of the connection area 53 in two pixels 19 longitudinally next to each other. In this embodiment, in a plan view, the connection area 53 is provided between the light-emitting area 55b and the light-emitting area 55r or 55g that are adjacent to each other and spaced apart from each other at a shorter distance than a reference distance (for example, an average distance). The connection area 53 is not provided between two light-emitting areas that are adjacent to each other and spaced apart from each other at a longer distance than the reference distance (between the light-emitting area 55r and the light-emitting area 55g and between the light-emitting areas 55b adjacent to each other). A carrier is more likely to leak as the distance between light-emitting areas decreases. Thus, providing the connection area 53 at a position where the leakage tends to occur can restrain the influence of the leakage, even if the connection area 53 is not arranged in all the spaces between the light-emitting areas 55r, 55g, 55b.

On the pixel electrode 41, the electron injection layer 47, the electron transport layer 46, the light-emitting layer 45, the hole transport layer 44, and the hole injection layer 43 may be provided in this order, and the pixel electrode 41 may supply an electron as a carrier. Even in this case, providing the connection area 53 on the electron injection layer 47 or the electron transport layer 46 can prevent an electron as a carrier generated in one light-emitting area from causing the light-emitting layer 45 in the adjacent light-emitting area to emit light. Also, an increase in manufacturing processes can be prevented.

Second Embodiment

A second embodiment is different in that the counter electrode 49 does not have any role for a carrier to vanish on the bank 32. The following description is mainly about the difference from the first embodiment.

Figure 10:
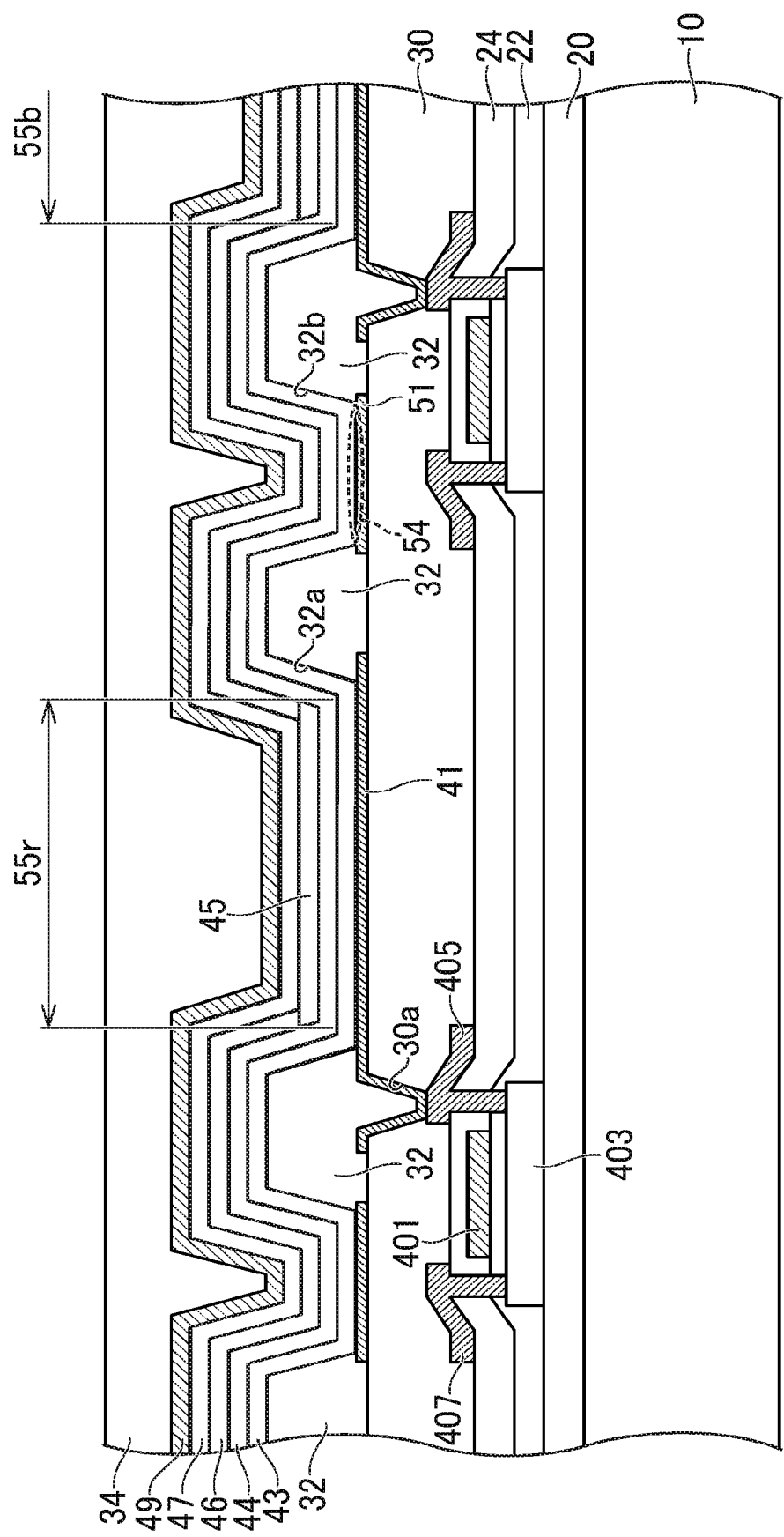
FIG. 10 is a cross-sectional view of an organic EL display device according to a second embodiment.

FIG. 10 is a cross-sectional view of an organic EL display device according to the second embodiment and corresponds to FIG. 3. In the example of FIG. 10, the pixel electrode 41 and an intermediate electrode 51 situated between the pixel electrodes 41 adjacent to each other are formed on the flattening layer 30. The pixel electrode 41 and the intermediate electrode 51 are formed in the same layer and are formed by the same process of patterning after forming a metal layer. The pixel electrode 41 and the intermediate electrode 51 may be formed by patterning different metal layers from each other.

The bank 32 is formed in the upper layer of the flattening layer 30, the pixel electrode 41, and the intermediate electrode 51. The bank 32 is provided between unit pixels that are adjacent to each other. The bank 32 has the opening 32a corresponding to a unit pixel. The bank 32 also has an opening 32b between the openings 32a that are adjacent to each other. At the bottom of the opening 32b, the intermediate electrode 51 is exposed from the bank 32.

On the pixel electrode 41, the hole injection layer 43, the hole transport layer 44, the light-emitting layer 45, the electron transport layer 46, and the electron injection layer 47 are provided in this order. These layers may be formed by vapor deposition or by coating. The light-emitting layer 45 is arranged inside the opening 32a. The hole injection layer 43, the hole transport layer 44, the electron transport layer 46, and the electron injection layer 47 are formed continuously from the inside of the opening 32a of the bank 32 to the upper side of the bank 32 and also covering the opening 32b. The lower surface of the hole transport layer 44 is in contact with the intermediate electrode 51 in a connection area 54.

The intermediate electrode 51 is connected to a wiring that supplies a predetermined potential. The predetermined potential may be lower than the potential supplied to the pixel electrode 41 and the same as the potential supplied to the counter electrode 49.

The counter electrode 49 is provided on the electron injection layer 47. The sealing layer 34 is provided on the counter electrode 49.

Figure 11:
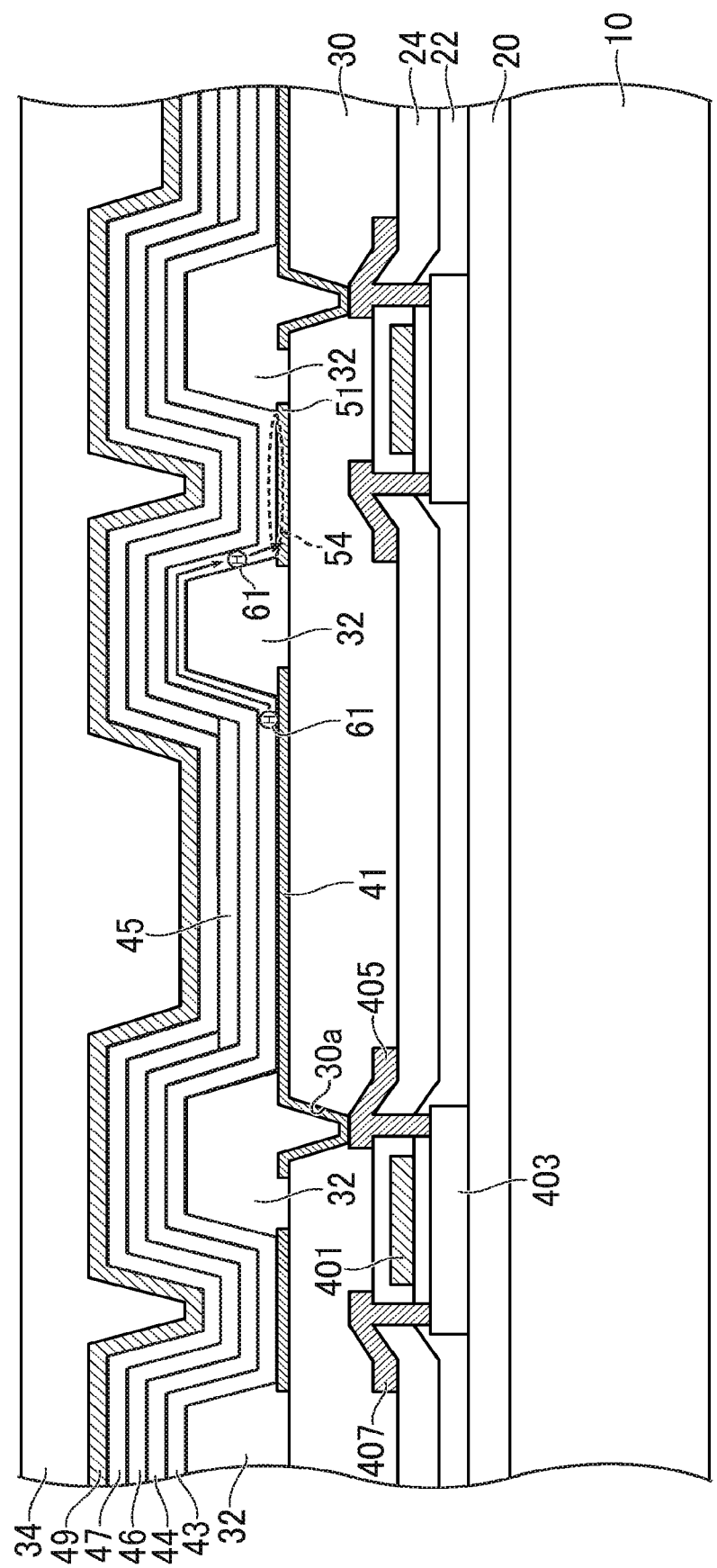
FIG. 11 is a diagram for illustrating a movement of a carrier.

FIG. 11 illustrates a movement of a carrier and corresponds to FIG. 10. As shown in FIG. 11, the hole 61, which is a carrier generated near the pixel electrode 41 in the hole injection layer 43, moves to above the bank 32 from the pixel electrode 41 due to an electric field generated inside the hole injection layer 43. The hole 61 is coupled with an electron supplied from the intermediate electrode 51 in the connection area 54 and thus vanishes. The hole 61 on the bank 32 vanishes on the intermediate electrode 51 and therefore does not reach the light-emitting layer 45 in the light-emitting area 55b situated ahead of the connection area 54.

The configuration shown in FIGS. 10 and 11, too, can prevent another light-emitting area adjacent to the one light-emitting area from slightly emitting light. Also, since the pixel electrode 41 and the intermediate electrode 51 are formed in the same layer, an increase in manufacturing processes can be prevented.

On the pixel electrode 41, the electron injection layer 47, the electron transport layer 46, the light-emitting layer 45, the hole transport layer 44, and the hole injection layer 43 may be provided in this order, and the pixel electrode 41 may supply an electron as a carrier. In this case, for example, the predetermined potential supplied by the wiring connected to the intermediate electrode 51 may be higher than the potential supplied to the pixel electrode 41 and the same as the potential supplied to the counter electrode 49.

The invention is not limited to the foregoing embodiments and can be carried out with various modifications. For example, a configuration described in the embodiments can be replaced with a configuration that is substantially the same, a configuration having the same advantageous effect, or a configuration that can achieve the same objective.

What is claimed is:

1. A display device comprising:
    a substrate;
    a plurality of pixel electrodes provided above the substrate;
    a first carrier injection layer and a first carrier transport layer provided in order on the plurality of pixel electrodes;
    a light-emitting layer provided above the plurality of pixel electrodes and on the first carrier transport layer;
    a second carrier transport layer and a second carrier injection layer provided in order on the light-emitting layer; and
    a counter electrode provided above the plurality of pixel electrodes and on the second carrier injection layer,
    wherein the second carrier layers have a polarity opposite to that of the first carrier layers,
    one layer of the first carrier transport layer and the first carrier injection layer has, between two pixel electrodes adjacent to each other in a plan view, a connection area exposed from a layer situated between the one layer and the counter electrode, wherein the two pixel electrodes are among the plurality of pixel electrodes, and
    the counter electrode is connected to the one layer in the connection area.

2. The display device according to claim 1. wherein
    the one layer is the first carrier injection layer, and
    the first carrier transport layer exposes the connection area.

3. The display device according to claim 1, wherein
    the one layer is the first carrier transport layer, and
    the first carrier injection layer is situated on the other side of the connection area from the counter electrode.

4. The display device according to claim I, further comprising
    a bank situated on the plurality of pixel electrodes and having an opening to expose a part of a pixel from the plurality of pixel electrodes,
    wherein at least apart of the light-emitting layer is provided inside the opening, and
    the one layer has the connection area above the bank.

5. The display device according to claim 1, wherein
    each of a plurality of light-emitting areas of the light-emitting layer is situated on a corresponding pixel electrode of the plurality of pixel electrodes,
    the plurality of light-emitting areas include a plurality of first light-emitting areas having a first size and a plurality of second light-emitting areas having a second size that is larger than the first size, and
    the connection area surrounds each of the plurality of first light-emitting areas and does not surround the plurality of second light-emitting areas, in a plan view.

6. The display device according to claim 1, wherein
    each of a plurality of light-emitting areas of the light-emitting layer is situated on a corresponding pixel electrode of the plurality of pixel electrodes,
    a space between light-emitting areas adjacent to each other, which are among the plurality of light-emitting areas, includes a first space and a second space that is larger than the first space, and
    the connection area is situated between the light-emitting areas adjacent to each other with the first space and is not arranged between the light-emitting areas adjacent to each other with the second space.

7. The display device according to claim 1, further comprising
    a pixel including two or more pixel electrodes of the plurality of pixel electrodes,
    wherein the connection area surrounds the pixel and is not provided between the two or more pixel electrodes in a plan view.

8. The display device according to claim I, further comprising
    a pixel including two or more pixel electrodes of the plurality of pixel electrodes,
    wherein the connection area surrounds the pixel and is provided between the two or more pixel electrodes in a plan view.

* * * * *